(12) United States Patent
Nishi et al.

(10) Patent No.: US 8,389,850 B2
(45) Date of Patent: Mar. 5, 2013

(54) SOLAR CELL MODULE AND METHOD OF MANUFACTURING THE SAME

(75) Inventors: Kouji Nishi, Ise (JP); Hiroshi Morita, Ise (JP); Tatsuya Yashiki, Takarazuka (JP); Motofumi Mihara, Itami (JP); Toshikazu Kajiwara, Ise (JP); Michikazu Matsushima, Ise (JP); Toshiyuki Yuasa, Ise (JP)

(73) Assignee: Kyocera Corporation, Kyoto (JP)

( * ) Notice: Subject to any disclaimer, the term of this patent is extended or adjusted under 35 U.S.C. 154(b) by 199 days.

(21) Appl. No.: 12/922,128

(22) PCT Filed: Mar. 12, 2009

(86) PCT No.: PCT/JP2009/054815
§ 371 (c)(1), (2), (4) Date: Dec. 13, 2010

(87) PCT Pub. No.: WO2009/113643
PCT Pub. Date: Sep. 17, 2009

(65) Prior Publication Data
US 2011/0083717 A1   Apr. 14, 2011

(30) Foreign Application Priority Data
Mar. 12, 2008   (JP) ................... 2008-063108

(51) Int. Cl.
   *H02N 6/00*   (2006.01)
   *H01L 31/042*   (2006.01)
   *H01L 21/00*   (2006.01)
(52) U.S. Cl. ......................................... 136/244; 438/64

(58) Field of Classification Search ................... 136/244; 257/E31.117; 438/64
See application file for complete search history.

(56) References Cited

FOREIGN PATENT DOCUMENTS

| JP | 63-034982 | 2/1988 |
|---|---|---|
| JP | 02-213173 | 8/1990 |
| JP | 03-204979 | 9/1991 |
| JP | 06-177412 | 6/1994 |
| JP | 11-307791 | 11/1999 |
| JP | 2007-201316 | 8/2007 |

OTHER PUBLICATIONS

Japanese language office action dated Sep. 18, 2012 and its English language translation issued in corresponding Japanese application 2010502884.

*Primary Examiner* — Jonathan Johnson
*Assistant Examiner* — Tamir Ayad
(74) *Attorney, Agent, or Firm* — DLA Piper LLP (US)

(57) ABSTRACT

A solar cell module includes a base body, a plurality of solar cell elements arranged at intervals over the base body, a resin layer disposed on the solar cell elements and comprising a plurality of recesses on its surface facing opposite to the solar cell elements, and a protective sheet disposed on the resin layer. The protective sheet comprises a plurality of protrusions which correspond to the recesses of the resin layer and which are in contact with the recesses. The height of first protrusion at a location corresponding to the interval between the solar cell elements among the plurality of protrusions is higher than the height of second protrusion at a location corresponding to the solar cell element among the plurality of protrusions. The interval between adjacent ones of the second protrusions in a portion corresponding to an end portion of the base body in longer than the interval between adjacent ones of the second protrusions in a portion corresponding to a central portion of the base body.

12 Claims, 12 Drawing Sheets

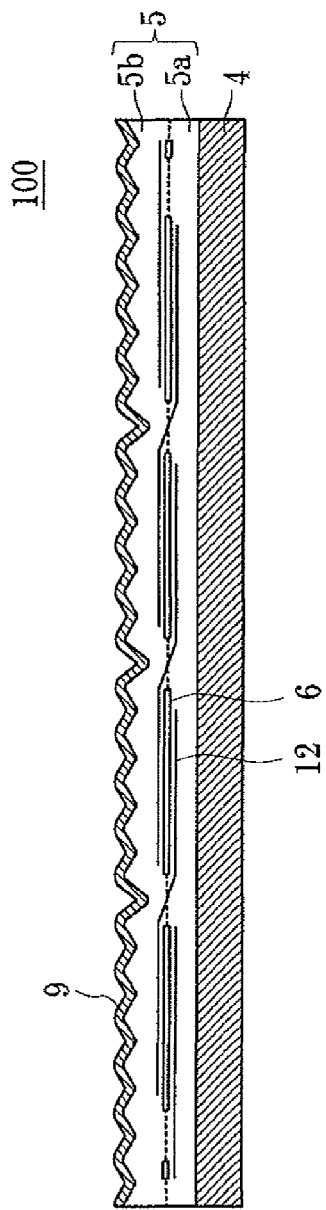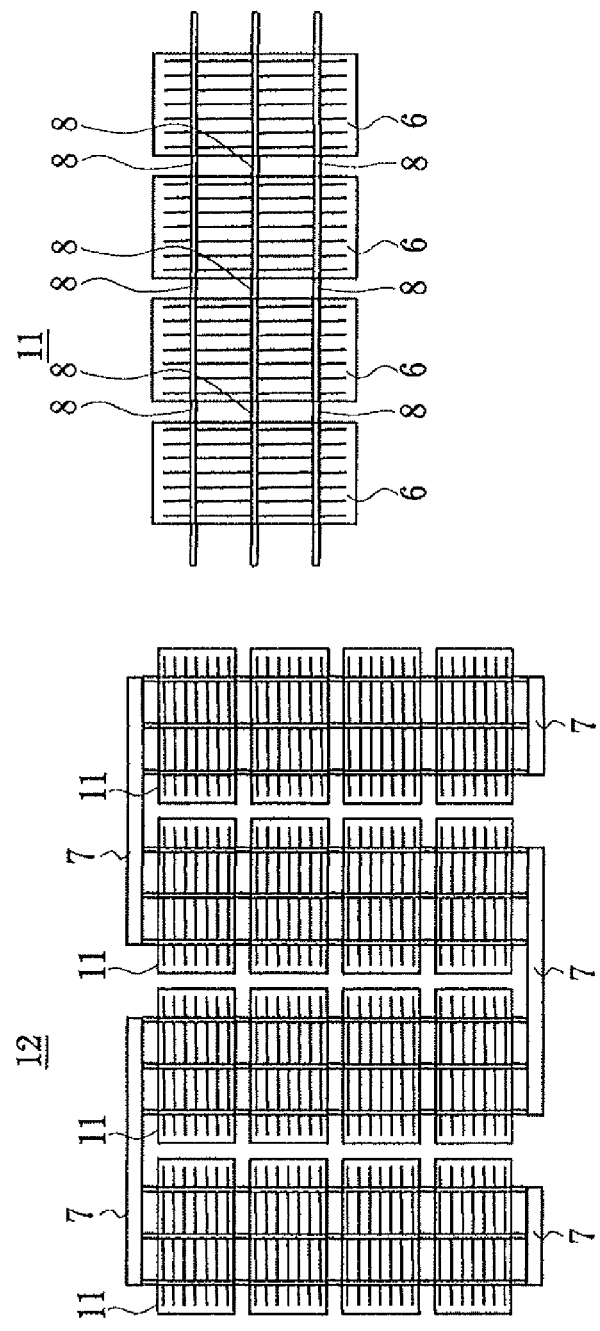

F I G . 7
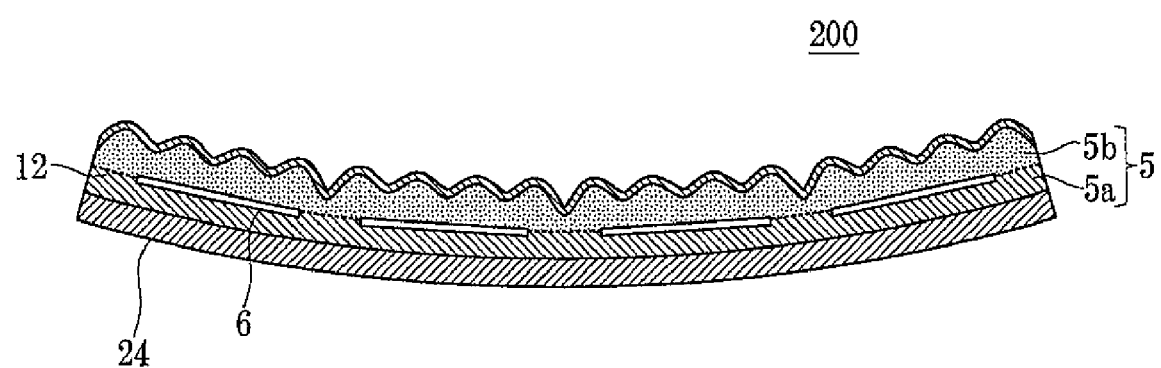

SOLAR CELL MODULE AND METHOD OF MANUFACTURING THE SAME

CROSS-REFERENCE TO THE RELATED APPLICATIONS

This application is a national stage of international application No. PCT/JP2009/054815 filed on Mar. 12, 2009, and claims the benefit of priority under 35 USC 119 to Japanese Patent Application No. 2008-063108, filed on Mar. 12, 2008, the entire contents of which are incorporated herein by reference.

TECHNICAL FIELD

The present invention relates to a solar cell module and a method of manufacturing the same.

BACKGROUND ART

With the recent increasing momentum toward environmental protection, the market for a solar cell module is expanding.

Enlargement in the size of the solar cell module is demanded, in order to obtain higher photoelectric conversion energy.

Additionally, in recent years, it is demanded that a main surface of the solar cell module be formed as a curved surface, in order to obtain a design in which an installation object and the solar cell module are integrated with each other.

However, there is for example a problem that, in forming a large-size solar cell module, members exhibit thermal expansion and contraction during integration of the members, to cause a misalignment or the like among the members, which tends to promote occurrence of wrinkles in a back-surface sheet.

There is also a problem that, when a solar cell module whose main surface has a curved surface is formed in the above-described embodiment, a remaining part of a back-surface sheet not conforming a curved surface of a light-transmitting subs hate forms wrinkles or rises up from a cross-linkable resin during integration of members. Particularly, the tendency to cause wrinkles or stay of air within wrinkles is higher at an end portion of the back-surface sheet. There is a problem that wrinkles occurring in the back-surface sheet easily allow entrance of oxygen and moisture therethrough, so that the cross-linkable resin is yellowed or absorbs moisture to consequently deteriorate.

DISCLOSURE OF THE INVENTION

A solar cell module and a method of manufacturing the same according to the present invention mainly aim at reducing the above-described wrinkles of the back-surface sheet.

A solar cell module according to an embodiment of the present invention includes: a base body; a plurality of solar cell elements arranged at intervals over the base body; a resin layer disposed on the solar cell elements and having a plurality of recesses on its surface facing opposite to the solar cell elements; and a protective sheet disposed on the resin layer. The protective sheet has a plurality of protrusions which correspond to the recesses of the resin layer and which are in contact with the recesses. The height of first protrusion at a location corresponding to the interval between the solar cell elements among the plurality of protrusions is higher than the height of second protrusion at a location corresponding to the solar cell element among the plurality of protrusions, the interval between adjacent ones of the second protrusions in a portion corresponding to an end portion of the base body is longer than the interval between adjacent ones of the second protrusions in a portion corresponding to a central portion of the base body.

In this solar cell module, stress caused by a difference among members in the length of thermal expansion and contraction can be efficiently relieved by the protrusions of the protective sheet. Thus, stress which may cause wrinkles in the protective sheet can be reduced.

A solar cell module according to an embodiment of the present invention includes: a base body; a plurality of solar cell elements arranged at intervals over the base body; a resin layer disposed on the solar cell elements and having a plurality of recesses on its surface facing opposite to the solar cell elements; and a protective sheet disposed on the resin layer. The protective sheet has a plurality of protrusions which correspond to the recesses of the resin layer and which are in contact with the recesses. The height of first protrusion at a location corresponding to the interval between the solar cell elements among the plurality of protrusions is higher than the height of second protrusion at a location corresponding to the solar cell element among the plurality of protrusions, the height of said second protrusion located in a portion corresponding to an end portion of said base body is higher than the height of the second protrusion located in a portion corresponding to a central portion of the base body.

In this solar cell module, stress caused by a difference among members in the length of thermal expansion and contraction can be efficiently relieved by the protrusions of the protective sheet. Thus, stress which may cause wrinkles in the protective sheet can be reduced.

A method of manufacturing a solar cell module according to an embodiment of the present invention includes the steps of: preparing a module laminate which is formed by a solar cell element, a resin layer, and a protective sheet being put in layers in the mentioned order on a base body; forming a plurality of protrusions on a surface of the resin layer side of the protective sheet; and heating the resin layer in order to cure the resin layer, wherein the heating the resin layer is performed simultaneously with the forming the plurality of protrusions or after the step of forming the plurality of protrusions.

In this method of manufacturing a solar cell module, the plurality of protrusions formed in the protective sheet provide unevenness which can reduce large wrinkles occurring in the protective sheet.

BRIEF DESCRIPTION OF THE DRAWINGS

FIGS. 1A to 1C are diagram showing a configuration of a solar cell module according to a first embodiment of the present invention.

FIG. 7 is a cross-sectional view showing a configuration of a solar cell module according to a second embodiment of the present invention.

BEST MODE FOR CARRYING OUT THE INVENTION

First Embodiment

<1-1. Configuration of Solar Cell Module>

Figure 2:
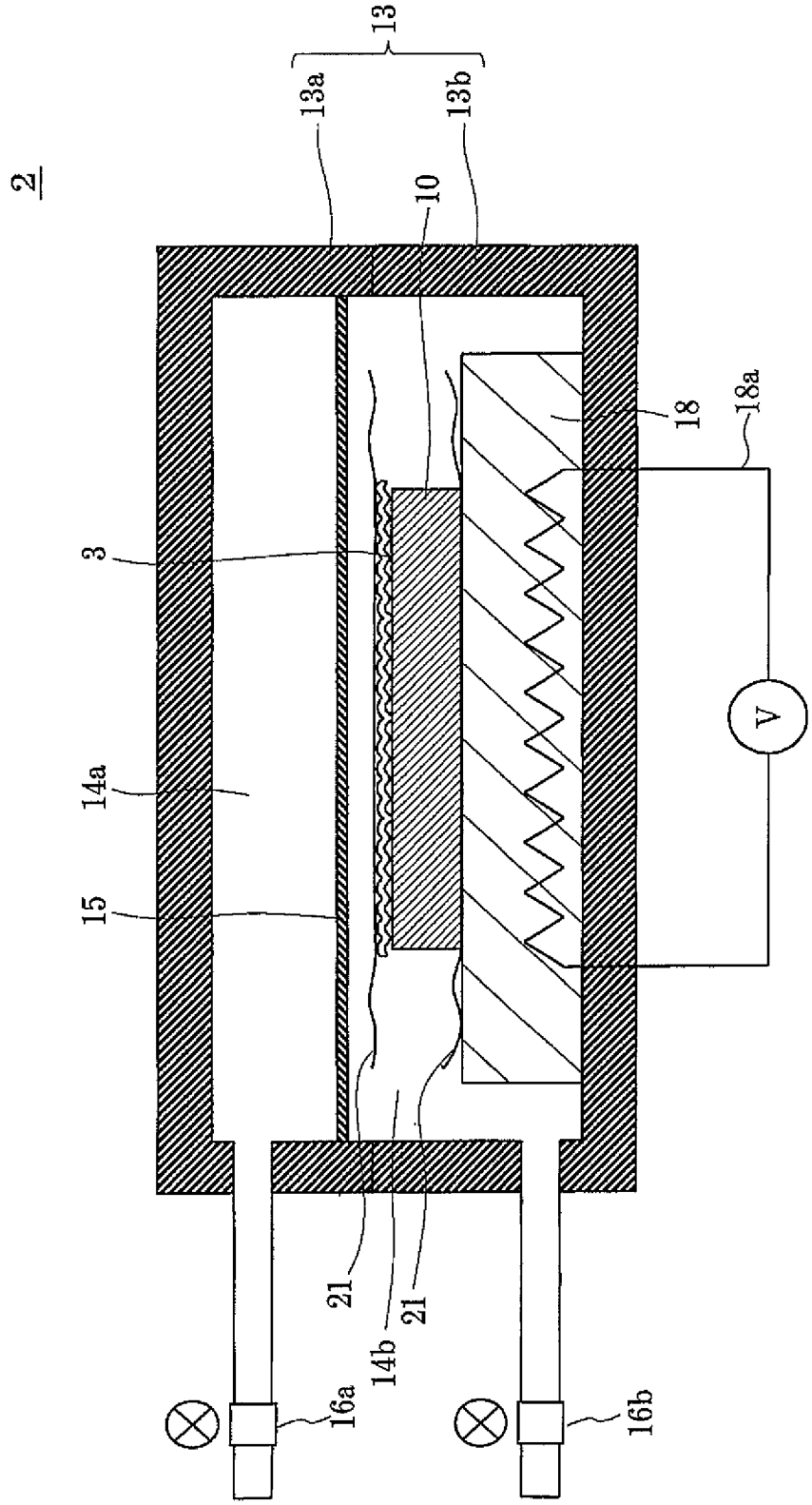
FIG. 2 is a cross-sectional view showing a configuration of a laminating apparatus used in manufacturing the solar cell module according to the first embodiment of the present invention.

Firstly, a configuration of a solar cell module 100 according to a first embodiment of the present invention is described.

FIG. 1A is a cross-sectional view showing the configuration of the solar cell module 100 according to the first embodiment of the present invention. FIG. 1B is a plan view showing a solar cell string 11 in the solar cell module 100. FIG. 1C is a plan view showing a configuration of a string assembly 12 having a plurality of solar cell strings 11 coupled to one another in the solar cell module 100.

The solar cell module 100 mainly includes a light-transmitting substrate 4, a resin layer 5, and a back-surface sheet 9. The resin layer 5 is formed on the light-transmitting substrate 4 so as to seal the string assembly 12. The back-surface sheet 9 is formed on the resin layer 5.

The solar cell string 11 includes a plurality of solar cell elements 6, and connecting conductors 8 which electrically connect positive electrodes and negative electrodes of the adjacent solar cell elements 6. The plurality of solar cell elements 6 are connected in series with one another by the connecting conductors 8.

The string assembly 12 includes a plurality of solar cell strings 11, and a plurality of coupling electrodes 7 which connect end portions of the adjacent solar cell strings 11. Each of the solar cell strings 11 is connected in series with the adjacent solar cell string 11 by the coupling electrode 7.

In this connecting manner, all the solar cell elements 6 are electrically connected in series with one another in the string assembly 12.

Next, each component of the solar cell module 100 is described.

(Light-Transmitting Substrate)

The light-transmitting substrate 4 serves as a base body. Therefore, a material of the light-transmitting substrate 4 is not particularly limited, as long as the light-transmitting substrate 4 is a member capable of transmitting an incident light therethrough to the solar cell elements 6. However, it is preferable to use a member having a high light transmittance which is made of a glass such as a white glass, a toughened glass, and a heat-reflecting glass, or a polycarbonate resin, etc. Preferably, the thickness of the light-transmitting substrate 4 is, for example, approximately 3 mm to 5 mm when a white toughened glass is used, and approximately 5 mm when a synthetic resin substrate (made of a polycarbonate resin or the like) is used.

(Resin Layer)

The resin layer 5 serves to seal the solar cell elements 6. In this embodiment, the resin layer 5 is formed as an integration of a first resin layer 5a and a second resin layer 5b. As the resin layer 5, it is preferable to use a cross-linkable resin such as a thermosetting resin or a resin having thermosetting characteristics which is obtained by adding a cross-linking agent to a thermoplastic resin. It is preferable that each of the first resin layer 5a and the second resin layer 5b has a thickness of approximately 0.4 to 1 mm. As this resin layer 5, for example, the above-mentioned cross-linkable resin which is formed into a sheet shape by an extruder and then is cut may be used. The resin layer 5 has a plurality of recesses formed on a surface thereof facing opposite to the solar cell element 6 side. In this embodiment, the recesses are formed in the second resin layer 5b.

For example, an acrylic resin, a silicon resin, an epoxy resin, and the like, may be used as the thermosetting resin.

Preferably, the thermoplastic resin has, as a main component, ethylene-vinyl acetate copolymer (EVA), polyvinyl butyral (PVB), ethylene-ethyl acrylate copolymer (EEA), and the like, for example. The cross-linking agent serves to link molecules of the thermoplastic resin. For example, an organic peroxide which decomposes at a temperature of 70 to 180° C. to generate a radical may be used as the cross-linking agent. As the organic peroxide, for example, 2,5-dimethyl-2, 5-bis(t-butylperoxy)hexane, tert-hexyl peroxypivalate, or the like, may be used. It is preferable that the organic peroxide is contained at a ratio of approximately one part by mass to 100 parts by mass of EVA, for example.

From the viewpoint of improving a performance of transmitting a light to the solar cell elements 6, it is preferable that a material having a high light transmissivity is used as the first resin layer 5a. On the other hand, from the viewpoint of improving a design in accordance with the installation environment of the solar cell module 100, a material to which a titanium oxide, a pigment, or the like, is added and which is thereby given a desired color may be used as the second resin layer 5b.

(Solar Cell Element)

For example, a single-crystal or poly-crystal silicon substrate is used as the solar cell elements 6. The silicon substrate may have a thickness of approximately 0.2 to 0.3 mm, and a size of approximately 150 to 160 mm square, for example. The silicon substrate has a PN junction provided by a P-type semiconductor layer and an N-type semiconductor layer being bonded to each other. The P-type semiconductor layer has a high content of P-type impurities such as boron. The N-type semiconductor layer has a high content of N-type impurities such as phosphorus. The silicon substrate has, on its front surface and/or back surface, an electrode which is made of a silver paste or the like and formed by a screen-printing method or the like. For the purpose of protection of the electrode or ease of mounting the connecting conductor 8 to the electrode, substantially the entire surface of the electrode may be coated with a solder.

The solar cell element 6 is not limited to the above-described one using the crystal silicon substrate of the single-crystal or the poly-crystal silicon. Various solar cell elements may be used, such as an amorphous silicon type, an Si thin film type, a CIS type, a CIGS type, or a dye sensitized type.

(Connecting Conductor and Coupling Electrode)

It is preferable to use, as the connecting conductor 8, a wire material such as a copper foil which has the entire surface thereof coated with a solder of approximately 20 to 70 μm by means of plating or dipping, for example. For example, in a case where the solar cell element 6 using a poly-crystal silicon substrate of 150 mm square is used, the connecting conductor 8 preferably has a width of approximately 1 to 3 mm and a length of approximately 260 to 290 mm.

Preferably, similarly to the connecting conductor 8, the coupling electrode 7 is made of a copper foil and has the entire surface thereof coated with a solder, and has a width of approximately 4 to 8 mm.

(Back-Surface Sheet)

The back-surface sheet 9 serves as a protective sheet protecting the resin layer 5 and the solar cell elements 6, and is a sheet made of polyvinyl fluoride (PVF), polyethylene terephthalate (PET), polyethylene naphthalate (PEN), or the like, or a lamination thereof.

The thickness of the back-surface sheet 9 is, for example, approximately 10 μm to 50 μm, and preferably is 20 μm to 40 μm from the viewpoint of sufficiently ensuring a humidity resistance, weatherability, and the like, and further simplifying a transfer of unevenness which is described later.

A surface of the back-surface sheet 9 facing the solar cell element 6 has an unevenness including a plurality of protrusions. The protrusions are formed at positions corresponding to the recesses of the resin layer 5, so as to be in contact with inner surfaces of the recesses of the resin layer 5. Additionally, in the back-surface sheet 9, a protrusion at a location corresponding to an interval between the adjacent solar cell elements 6 with respect to an arrangement direction is higher than a protrusion at a location corresponding to an area where the solar cell element 6 is placed.

A reflecting member may be provided on the light-receiving surface side of the back-surface sheet 9. To form the reflecting member, for example, aluminium or the like is vapor-deposited on a light-receiving surface of the back-surface sheet 9. Thereby, a light incident through the interval between the adjacent solar cell elements 6 is diffusely reflected by the reflecting member, and this reflected light can also contribute to a photoelectric conversion. This can increase a power generation efficiency.

In the solar cell module 100 having the above-described configuration, as shown in FIG. 1A, the protrusions of the back-surface sheet 9 at the locations corresponding to the intervals between the adjacent solar cell elements 6 are high, as compared with the protrusions of the back-surface sheet 9 at the locations corresponding to the areas where the solar cell elements 6 are placed. Thus, the unevenness of the surface of the back-surface sheet 9 on which these protrusions are formed is large. That is, the solar cell module 100 is structured such that the protrusions of the back-surface sheet 9 protruding toward the light-transmitting substrate 4 side go deeper into the resin layer 5 in the regions corresponding to the areas above the intervals between the adjacent solar cell elements 6 than in the regions corresponding to the areas above the respective solar cell elements 6. In this solar cell module 100, the protrusions of the back-surface sheet 9 are made large at the locations corresponding to where the solar cell elements 6 are not placed, which increases the degree of freedom in the deformation of these protrusions, so that the stress caused by the difference among the members in the length of thermal expansion and contraction can be efficiently relieved.

<1-2. Structure of Laminating Apparatus>

Next, a structure of a laminating apparatus 2 which is used in manufacturing the solar cell module 100 according to the first embodiment of the present invention is described.

Figure 3:
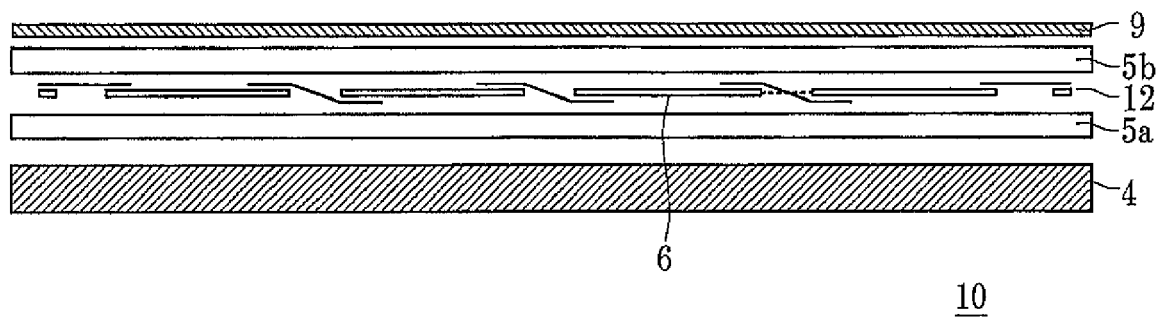
FIG. 3 is a cross-sectional view showing a state of lamination in a module laminate according to the first embodiment of the present invention.

FIG. 2 is a cross-sectional view showing a structure of the laminating apparatus 2 in which a module laminate 10 is placed. FIG. 3 is a cross-sectional view enlarging the module laminate 10 shown in FIG. 2 to show a configuration of the module laminate 10. The module laminate 10 has a configuration in which the first resin layer 5a, the string assembly 12, the second resin layer 5b, and the back-surface sheet 9 are stacked in the mentioned order on a non-light-receiving surface of the light-transmitting substrate 4.

The laminating apparatus 2 mainly includes a housing 13, a diaphragm sheet 15, a heater board 18, and a pressing member 3. The housing 13 includes an upper housing 13a and a lower housing 13b which are mutually openable and closable. The diaphragm sheet 15 divides the interior of the housing 13 into an upper vacuum region 14a and a lower vacuum region 14b. The heater board 18 is positioned substantially at the center of the interior of the lower housing 13b. The pressing member 3 is positioned between the diaphragm sheet 15 and the heater board 18.

An upper vacuum pump 16a is connected to the upper housing 13a, so that the pressure of the upper vacuum region 14a surrounded by the upper housing 13a and the diaphragm sheet 15 can be reduced by actuating the upper vacuum pump 16a. Similarly, a lower vacuum pump 16b is connected to the lower housing 13b, so that the pressure of the lower vacuum region 14b surrounded by the lower housing 13b and the diaphragm sheet 15 can be reduced by actuating the lower vacuum pump 16b.

It is preferable that a resin member such as a silicon rubber having excellent strength and stretchability is used for the diaphragm sheet 15.

A heater 18a is connected to the heater board 18, so that the module laminate 10 placed on the heater board 18 can be heated by applying voltage to the heater 18a.

The pressing member 3 is a member for forming, on the back-surface sheet 9, unevenness including a plurality of protrusions. The pressing member 3 has, for example, a resin sheet such as a silicon rubber sheet, a sheet-like textile, or the like. A surface (pressing surface) of the pressing member 3 which presses the back-surface sheet 9 has unevenness, in order to form a plurality of protrusions on the back-surface sheet 9. Using such a pressing member 3 can improve the reliability in integrating the module laminate 10. If a textile formed with glass fibers and impregnated with a fluorine resin such as polytetrafluoroethylene is used as the pressing member 3, a mold releasability of the back-surface sheet 9 and the resin layer 5 from the pressing member 3 can be improved.

Using such a pressing member 3 can improve the reliability in integrating the module laminate 10. If a textile formed with glass fibers and impregnated with a fluorine resin such as polytetrafluoroethylene is used as the pressing member 3, a mold releasability of the back-surface sheet 9 and the resin layer 5 from the pressing member 3 can be improved.

If a textile is used as the pressing member 3, unevenness formed by its texture is transferred to the back-surface sheet 9 in a later-described step. It is preferable that a pitch of the unevenness of the texture with respect to the horizontal direction is approximately 500 μm to 1500 μm. Additionally, it is preferable that a difference in height of the unevenness with respect to the vertical direction is approximately 30 μm to 200 μm from the viewpoint of enabling accurate transfer while reducing a load applied to the solar cell elements 6 during pressing.

In the laminating apparatus 2, for the purpose of relieving impact applied to the module laminate 10 during the manufacturing process, an urethane rubber (not shown) and a mold release sheet 21 may be provided in the mentioned order on the heater board 18. Furthermore, the mold release sheet 21 may also be provided on the pressing member 3. The mold release sheet 21 can inhibit the first resin layer 5a and the second resin layer 5b, which may leak out between the light-transmitting substrate 4 and the back-surface sheet 9, from adhering to the interior of the laminating apparatus 2.

<1-3. Method of Manufacturing Solar Cell Module>

Next, a method of manufacturing the solar cell module 100 according to the first embodiment of the present invention is described. In the following description, a case where a cross-linkable resin obtained by a cross-linking agent being contained in a thermoplastic resin is used for the resin layer 5 (the first resin layer 5a and the second resin layer 5b) is taken as an example.

(Press-Heating Step)

Figure 4:
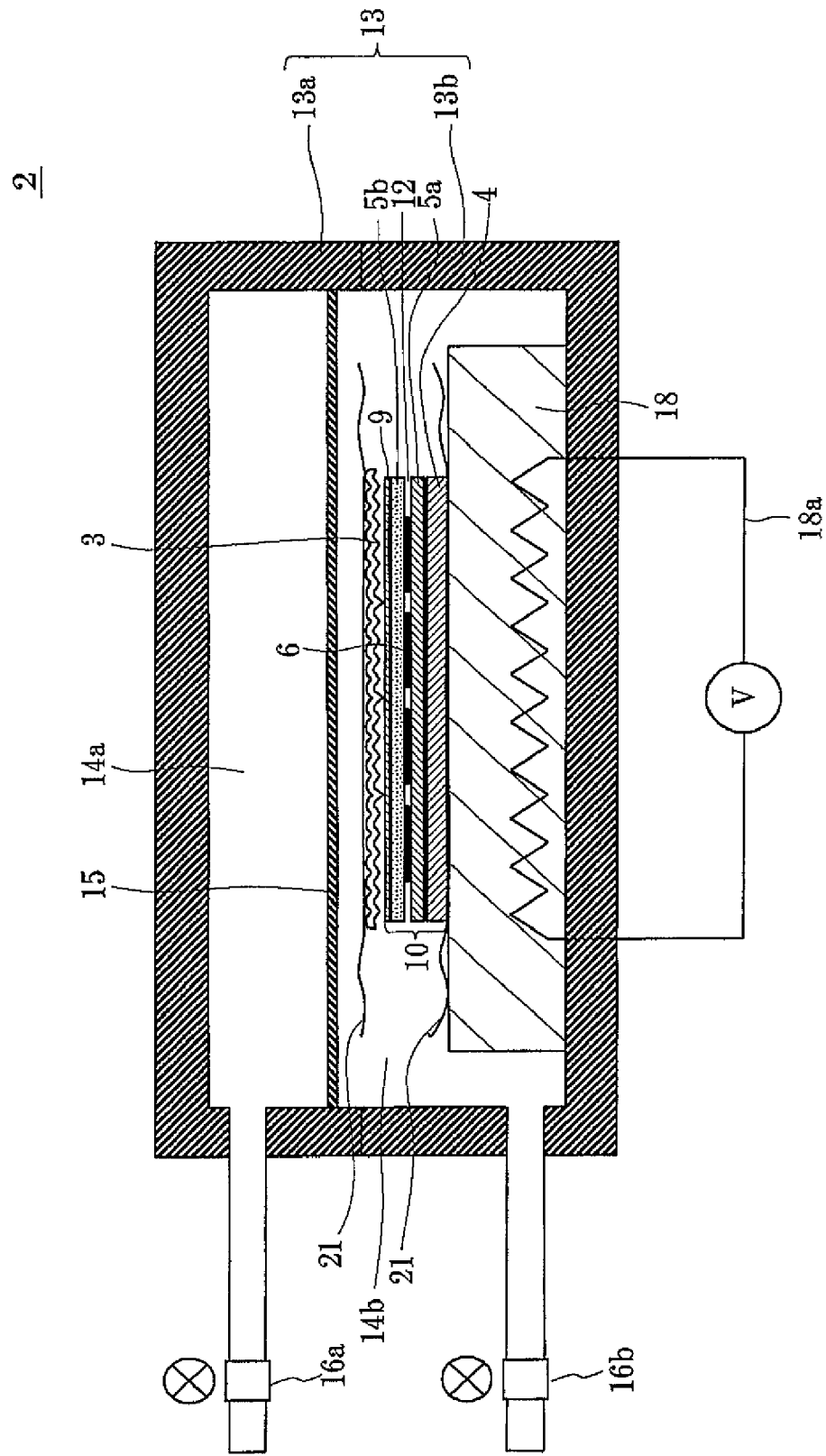
FIG. 4 is a cross-sectional view showing a method of manufacturing the solar cell module according to the first embodiment of the present invention.
Figure 5:
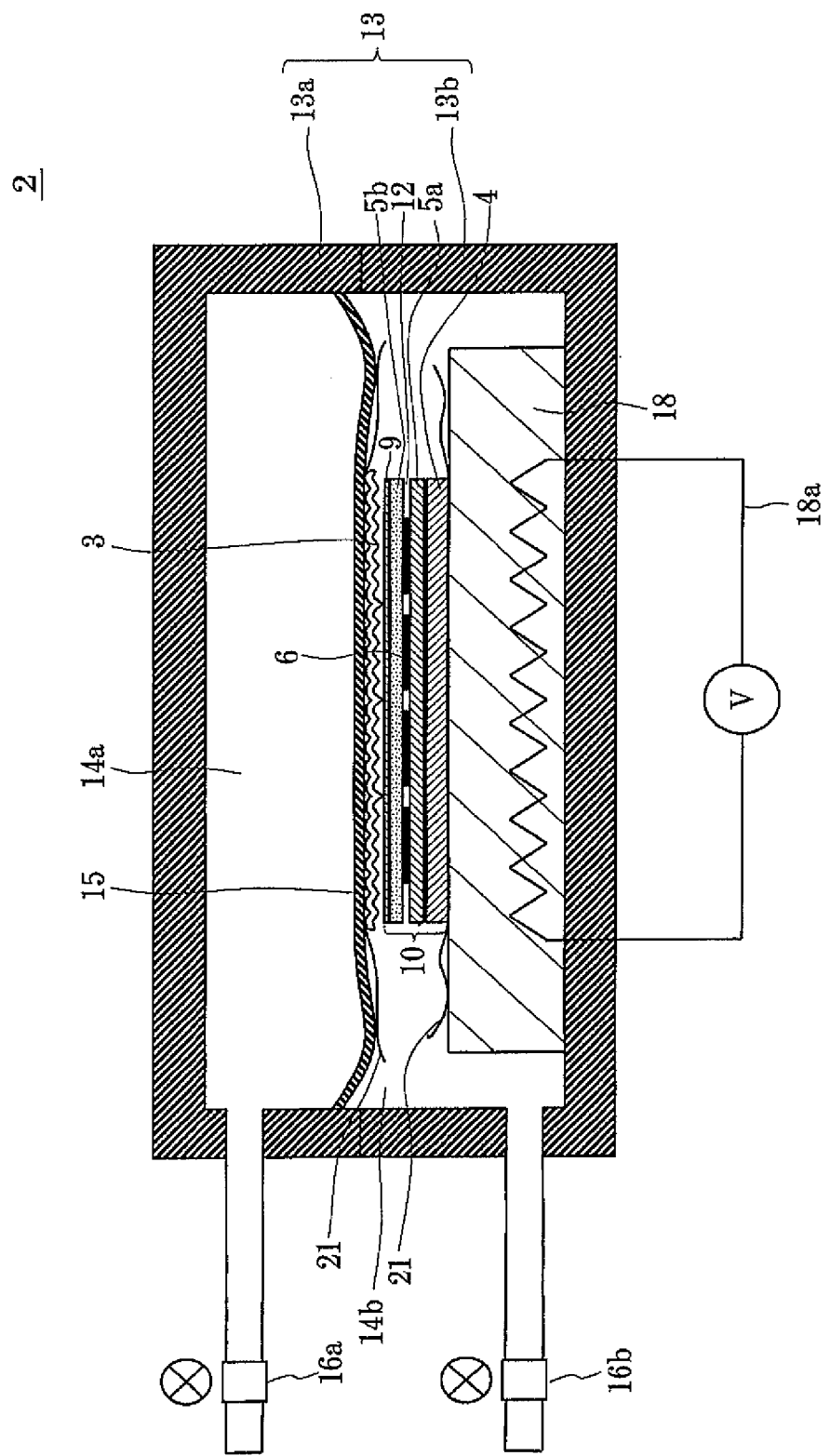
FIG. 5 is a cross-sectional view showing the method of manufacturing the solar cell module according to the first embodiment of the present invention.
Figure 6:
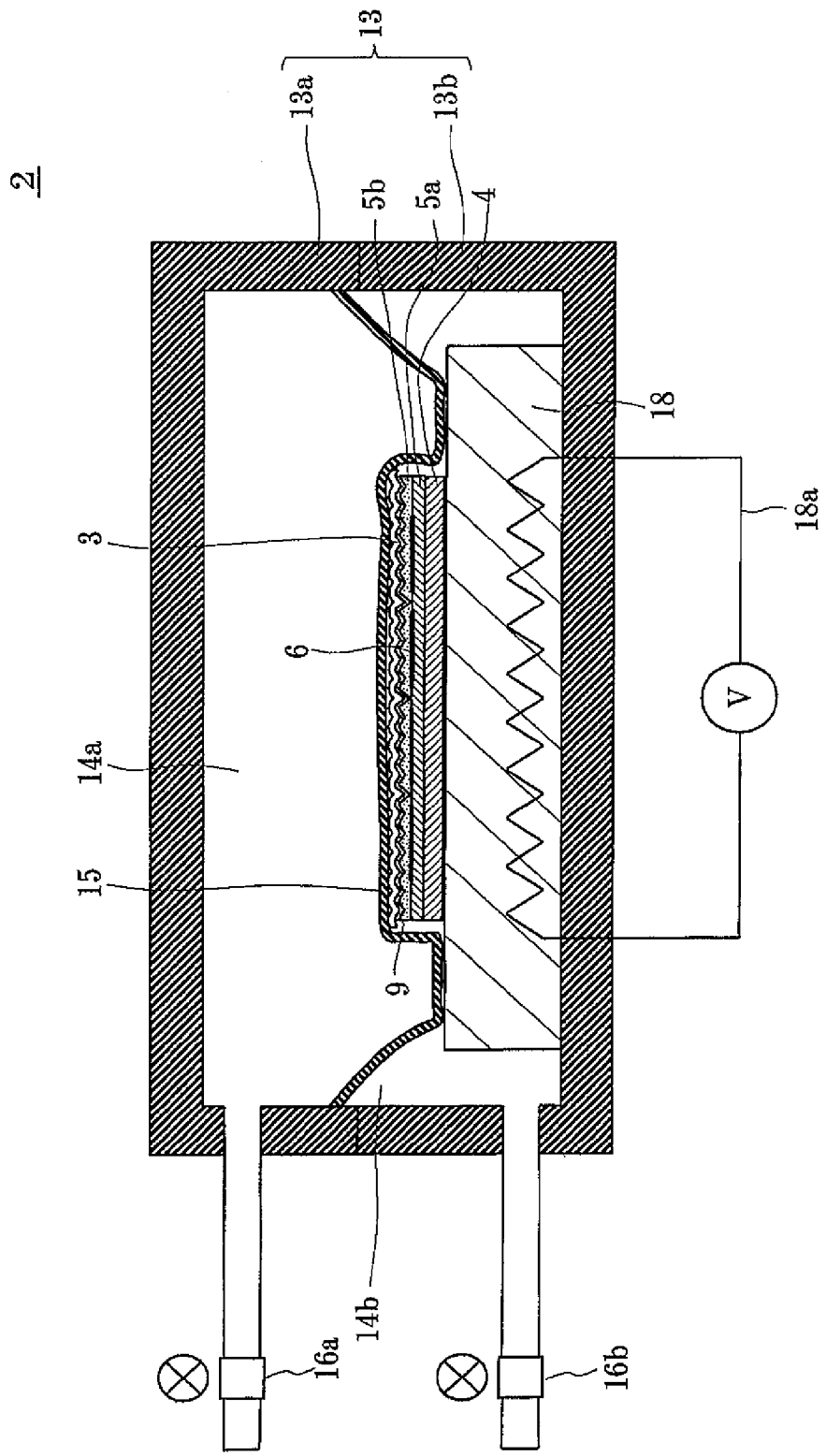
FIG. 6 is a cross-sectional view showing the method of manufacturing the solar cell module according to the first embodiment of the present invention.

Firstly, a step of press-heating the module laminate 10 in the laminating apparatus 2 is described. FIGS. 4 to 6 are diagrams showing, step-by-step, a state in the middle of the press-heating of the module laminate 10 in the laminating apparatus 2.

The upper housing 13a of the laminating apparatus 2 is first moved up to open the housing 13, and in this state, the module laminate 10 is placed on the mold release sheet 21 which is disposed on the heater board 18 in the lower housing 13b such that the light-transmitting substrate 4 faces downward.

Then, the pressing member 3 and the mold release sheet 21 are layered in the mentioned order on the back-surface sheet 9 of the module laminate 10. Then, the upper housing 13a is moved down toward the lower housing 13b side, to close the housing 13. Thus, the module laminate 10 is mounted in the laminating apparatus 2 (FIG. 4).

Then, the press-heating step is performed in which pressing is performed under a pressure condition allowing the unevenness of the pressing member 3 to be transferred to the back-surface sheet 9 and at the same time heating is performed under a temperature condition equal to or higher than a cross-linking temperature of the second resin layer 5b (FIG. 5). In the following, details of the pressing and the heating in the press-heating step are described.

The pressing of the module laminate 10 in the press-heating step is performed by providing a pressure difference between the upper vacuum region 14a and the lower vacuum region 14b of the laminating apparatus 2 so as to make the pressure of the upper vacuum region 14a higher. However, it is preferable that evacuation of the upper vacuum region 14a and the lower vacuum region 14b is initially performed, for the purpose of removing air bubbles existing inside the module laminate 10.

By providing such a pressure difference, the diaphragm sheet 15 swells toward the lower vacuum region 14b side. As a result, the diaphragm sheet 15 presses the module laminate 10 from the upper side of the mold release sheet 21. Therefore, even if the resin layer 5 is softened in the press-heating step, occurrence of a misalignment between the members of the module laminate 10 can be suppressed.

Then, the pressure of the upper vacuum region 14a is step by step made higher than the pressure of the lower vacuum region 14b, so that the diaphragm sheet 15 swells toward the lower vacuum region 14b side as shown in FIG. 5. The pressure difference between the upper vacuum region 14a and the lower vacuum region 14b may be, for example, 300 to 500 torr.

At this time, the diaphragm sheet 15 applies pressure of about 0.4 kgf/cm$^2$ to 0.67 kgf/cm$^2$ to the laminate 10. In this step, as shown in FIG. 6, the unevenness of the pressing member 3 is transferred to the back-surface sheet 9, and thus protrusions having substantially the same shape as that of the pressing member 3 are formed on the back-surface sheet 9 and recesses having substantially the same shape as that of the pressing member 3 are formed in the resin layer 5.

However, in the unevenness of the back-surface sheet 9 formed in this step, the protrusions protruding toward the light-transmitting substrate 4 side are larger in the regions above the intervals between the adjacent solar cell elements 6 than in the regions above the solar cell elements 6. This is because resistance the back-surface sheet 9 receives from the resin layer 5 during the pressing is smaller in the regions above the intervals of the adjacent solar cell elements 6 than in the regions above the solar cell elements 6.

Then, the heating of the module laminate 10 in the press-heating step is performed by the heater 18a heating the heater board 18. The resin forming the first resin layer 5a and the second resin layer 5b are softened by the heating, to be charged in the surrounding area of the solar cell elements 6 (FIG. 6). Then, the temperature is raised up to a temperature equal to or higher than the decomposing temperature of the contained cross-linking agent, so that cross-linking in the cross-linkable resin advances. Thereby, the molecular structure of the second resin layer 5b becomes a stable three-dimensional network having a cross-linking structure. The decomposing temperature of the cross-linking agent which is kneaded into the resin may be determined by, for example, a method of setting a reaction decomposition constant. The heating is performed until the shape of the resin forming the second resin layer 5b is stabilized (a low fluid state), that is, until the second resin layer 5b can maintain the unevenness transferred to the back-surface sheet 9.

For example, when the main component of the second resin layer 5b is EVA, it is preferable that the heating is performed such that the degree of cross-linking of the EVA becomes 50% or more. By setting the degree of cross-linking in this manner, when the module laminate 10 is further heated in a subsequent step, a deformation caused by softening of the second resin layer 5b can be suppressed. Therefore, the unevenness once transferred to the back-surface sheet 9 by the pressing member 3 can be maintained. Although in the above-described press-heating step, the pressing and the heating are performed substantially at the same time, the heating may be performed after the pressing.

As described above, the module laminate 10 is heated while being pressed such that the protrusions or and recesses having the same sizes as those of the protrusions and recesses in the unevenness formed in the pressing surface of the pressing member 3 can be formed on the surfaces of the back-surface sheet 9 and the resin layer 5. This can relieve wrinkles which have conventionally occurred in the back-surface sheet 9 during the integration of the module laminate 10.

The degree of cross-linking (%) can be measured in the following procedure.

Firstly, approximately 0.3 to 5 g of the cross-linkable resin for each of the first resin layer 5a and the second resin layer 5b is cut out, and the mass thereof is weighed. Then, the weighed cross-linkable resin is immersed in approximately 100 ml of a solvent of xylene or toluene, and left at 100 to 120° C. for 20 to 30 hours. Then, the resin is taken out of the solvent, and dried in the air at 60 to 100° C. for 5 to 8 hours. Subsequently, the mass of each resin is weighed. The degree of cross-linking of each resin is calculated by the following expression.

Degree of cross-linking (%)=(Mass after immersed in the solvent/Mass before immersed in the solvent)×100

(Heating Step)

Next, a heating step after the press-heating step is described. The heating step is a step of heating the module laminate 10 under a pressure condition not allowing the unevenness of the pressing member 3 to be transferred to the back-surface sheet 9 and under a temperature condition equal to or higher than the cross-linking temperature of the resin forming the second resin layer 5b. In this step, the pressing member 3 is removed from the module laminate 3, and the module laminate 10 is taken out of the laminating apparatus 2 and placed in a heating furnace (not shown), so that the heating furnace performs the heating.

As the heating furnace, a furnace capable of performing a heating at a temperature equal to or higher than the cross-linking temperature of the cross-linkable resin forming the first resin layer 5a and the second resin layer 5b is used. For example, the heating furnace is preferably structured such that the module laminate 10 can be heated while being conveyed by a conveyor passing through the heating furnace.

The module laminate 10 is heated within the heating furnace until the cross-linkable resin forming the second resin layer 5b is brought into a shape-fixed state (non-fluid state). Therefore, for example, when EVA is used as the main component of the second resin layer 5b, the second resin layer 5b is preferably heated until its degree of cross-linking becomes 90% or more.

Through the above-described heating step, a sufficient adhesive force between the back-surface sheet 9 and the second resin layer 5b can be obtained. Moreover, separation of the first resin layer 5a and the second resin layer 5b from the light-transmitting substrate 4 and the back-surface sheet 9, which may be caused by aging, can be effectively suppressed.

If a plurality of module laminates 10 which have been press-heated by the laminating apparatus 2 are together subjected to the heating step in a single heating furnace, a production efficiency of the solar cell module 100 can be improved.

(Terminal Box Fixing Step)

Then, a terminal box (not shown) whose casing is made of a polyphenylene ether resin or the like is fixed to the solar cell module 100 with an adhesive. Through this terminal box, power generated in the solar cell module 100 can be outputted to the outside. The solar cell module 100 is formed through the above-described steps.

As described above, in this embodiment, the integration of the module laminate 10 is performed while the unevenness of the pressing member 3 is being transferred to the back-surface sheet 9. This allows a highly reliable integration of the module laminate 10. Additionally, the difference in height in the unevenness of the back-surface sheet 9 is larger in the regions above the intervals between adjacent solar cell elements 6 than in the regions above the solar cell elements 6. This can more efficiently relieve the stress caused by the difference among the respective members in the length of thermal expansion and contraction.

Second Embodiment

Next, a solar cell module 200 according to a second embodiment of the present invention is described.

FIG. 7 is a cross-sectional view showing a configuration of the solar cell module 200 according to the second embodiment of the present invention. The configuration of the solar cell module 200 which is different from the configuration of the solar cell module 100 according to the first embodiment is described with reference to FIG. 7.

The solar cell module 200 mainly includes a light-transmitting substrate 24, a string assembly 12, a resin layer 5, and a back-surface sheet 9. The light-transmitting substrate 24 has a curved surface whose central portion protrudes relative to both end portions thereof in a direction opposite to the solar cell element 6 side. The string assembly 12 is provided over a back surface of the curved surface of the light-transmitting substrate 24. The resin layer 5 is formed on a back surface of the light-transmitting substrate 24 so as to seal the string assembly 12. The back-surface sheet 9 is formed on the resin layer 5. Each of the resin layer 5 and the back-surface sheet 9 after formed as the solar cell module 200 has a curved shape corresponding to the shape of the light-transmitting substrate 24. Similarly to the first embodiment, each of the back-surface sheet 9 and the resin layer 5 has unevenness. The light-transmitting substrate 24 as a whole is curved toward the side opposite to where the string assembly 12 is arranged.

Figure 8:
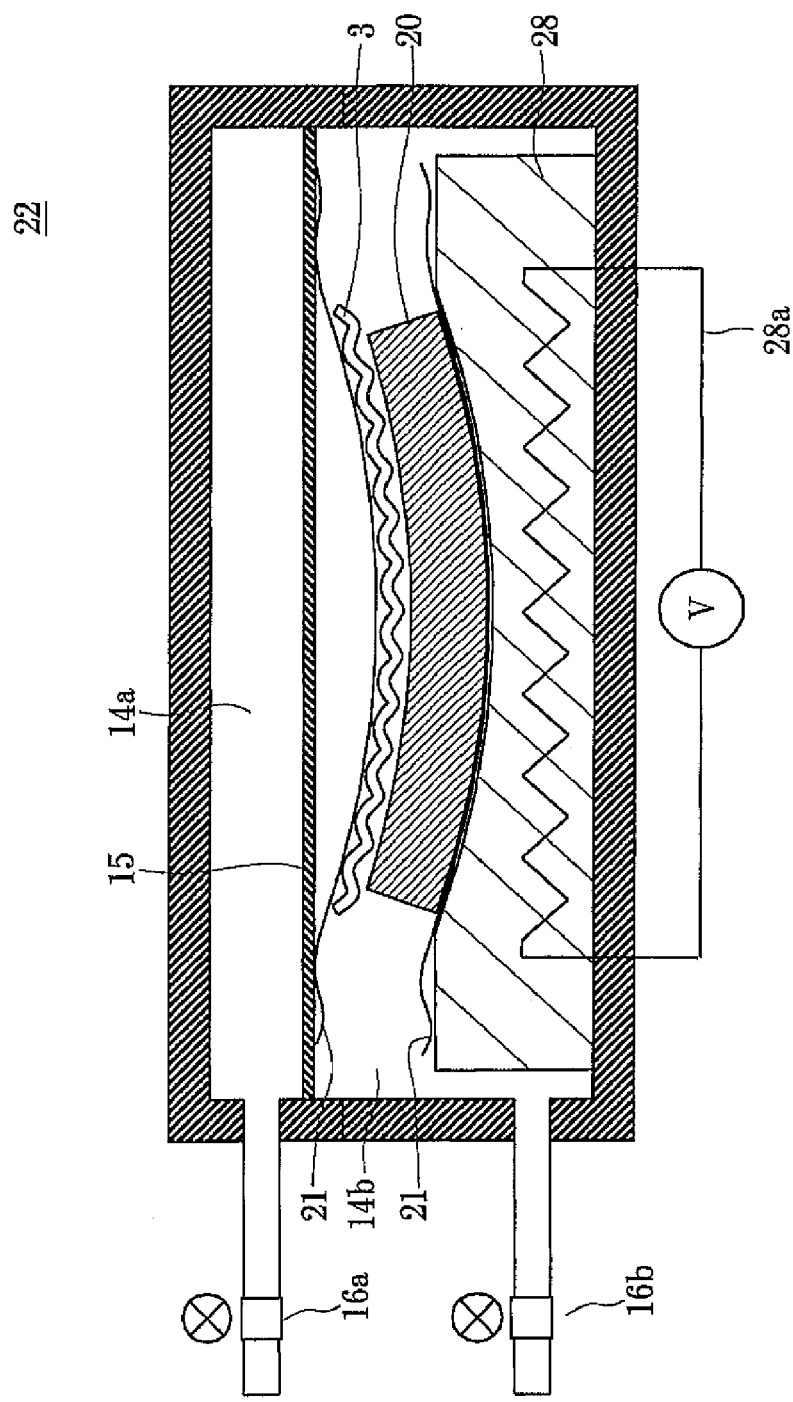
FIG. 8 is a cross-sectional view showing a configuration of a laminating apparatus used in manufacturing the solar cell module according to the second embodiment of the present invention.

FIG. 8 is a cross-sectional view showing a configuration of a laminating apparatus 22 used in manufacturing the solar cell module 200 according to the second embodiment of the present invention. The laminating apparatus 22 has a heater board 28 formed in a shape that an upper surface thereof has a concave curve so as to follow the curved shape of the light-transmitting substrate 24 mounted thereon. The other parts of the structure are the same as those of the laminating apparatus 2 according to the first embodiment.

Figure 9:
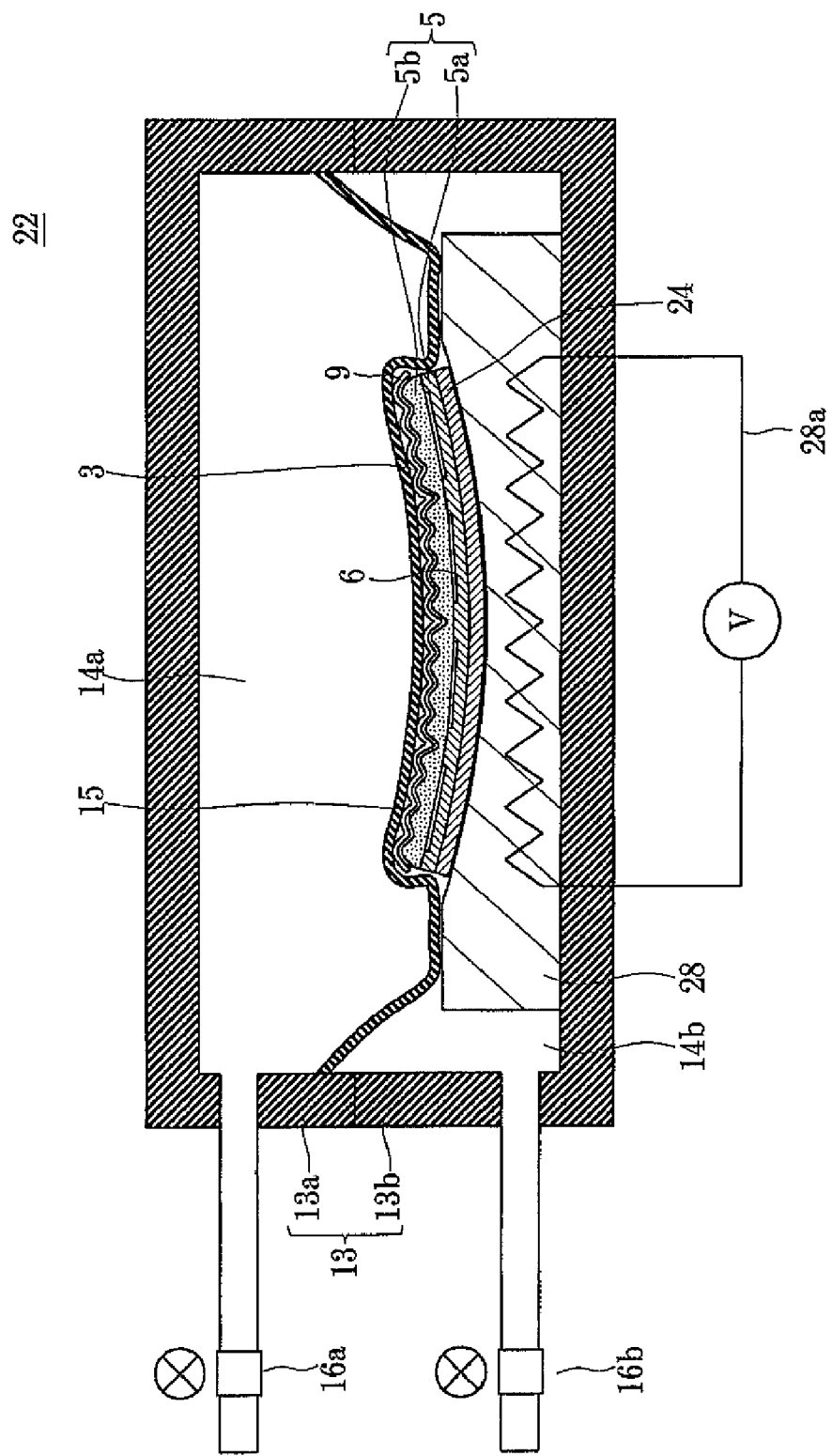
FIG. 9 is a cross-sectional view showing a method of manufacturing the solar cell module according to the second embodiment of the present invention.

FIG. 9 is a diagram showing a state after a module laminate 20 of this embodiment is press-heated. The module laminate 20 has a configuration in which the first resin layer 5a, the string assembly 12, the second resin layer 5b, and the back-surface sheet 9 are laminated in the mentioned order on a back surface of a convex curved surface of the light-transmitting substrate 4.

From the viewpoint of a change in the sheet thickness which is caused in integrating the members or the viewpoint of suppression of air remaining inside the laminate, it is preferable that the back-surface sheet 9 which is laminated in forming the module laminate 20 has a curved shape corresponding to the shape of the light-transmitting substrate 24. On the other hand, from the viewpoint of, when the back-surface sheet 9 is put on the second resin layer Sb, obtaining a high degree of freedom in positioning between the back-surface sheet 9 and the light-transmitting substrate 24 having the curved shape, it is preferable that the back-surface sheet 9 has a flat plate shape.

It is preferable that a textile is used as the pressing member 3 because, when pressing, spaces between fibers of the textile are flexibly changed in accordance with the shape of the light-transmitting substrate 4, to enable the back-surface sheet 9 to follow the shape of the light-transmitting substrate 4 with an enhanced accuracy.

In this embodiment, similarly to the first embodiment, the module laminate 20 is pressed and heated by using the laminating apparatus 22. As a result, each of the resin layer 5 and the back-surface sheet 9 is given a curved shape corresponding to the shape of the light-transmitting substrate 24 having the curved surface, and additionally the unevenness of the pressing member 3 is transferred to the back-surface sheet 9. Thus, the module laminate 20 which is curved as a whole is obtained. Even if the module laminate 20 is curved, wrinkles which have conventionally occurred in the back-surface sheet 9 can be relieved by performing the integration while transferring the unevenness.

As described above, in this embodiment, the light-transmitting substrate 24 and the members are integrated while the unevenness is being transferred to the back-surface sheet 9. Thereby, even if the module laminate 20 is curved, the integration can be performed with a high reliability.

Third Embodiment

Figure 10:
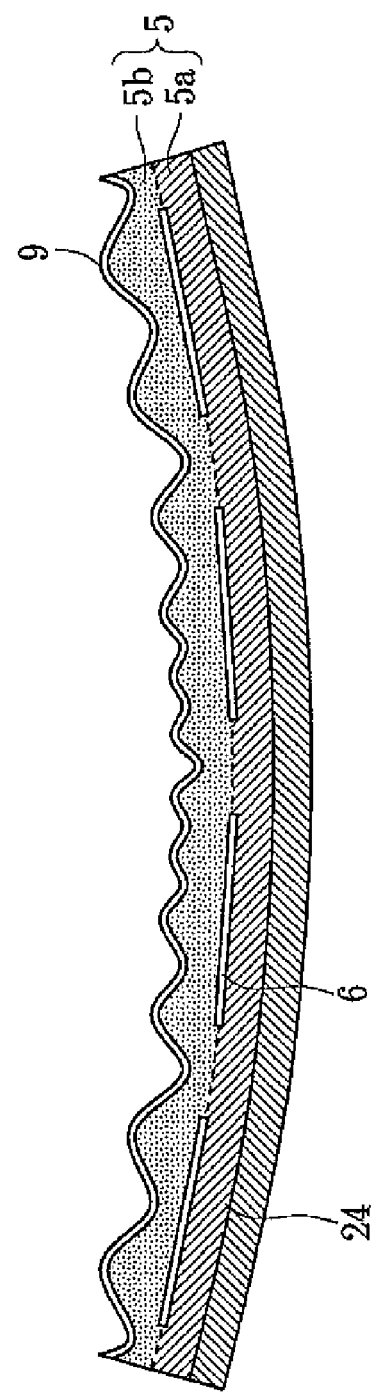
FIG. 10 is a cross-sectional view showing a configuration of a solar cell module according to a third embodiment of the present invention.

Next, a solar cell module 300 according to a third embodiment of the present invention is described. FIG. 10 is a cross-sectional view showing a configuration of the solar cell module 300 according to the third embodiment of the present invention.

The solar cell module 300 mainly includes a light-transmitting substrate 24, a string assembly 12, a resin layer 5, and a back-surface sheet 9. The light-transmitting substrate 24 has a curved surface whose central portion protrudes relative to both end portions thereof in a direction opposite to the solar cell element 6 side. The string assembly 12 is provided over the back surface side of the curved surface. The resin layer 5 is formed on the light-transmitting substrate 24 so as to seal the string assembly 12. The back-surface sheet 9 is formed on the resin layer 5. Each of the resin layer 5 and the back-surface sheet 9 has a curved shape corresponding to the shape of the light-transmitting substrate 24.

In this embodiment, similarly, the back-surface sheet 9 has a wave shape including a plurality of protrusions. However, this embodiment is different from the second embodiment, in that the interval between the adjacent protrusions of the back-surface sheet 9 and the height of the protrusion of the back-surface sheet 9 become larger with distance from a central portion of the curved surface of the light-transmitting substrate 24. Such a shape is adopted in the back-surface sheet 9, in order to effectively reduce wrinkles which tend to occur in end portions of the back-surface sheet 9 when the members are integrated, as described later. The resin layer 5 which is brought into contact with the back-surface sheet 9 is also given the same unevenness.

Figure 11:
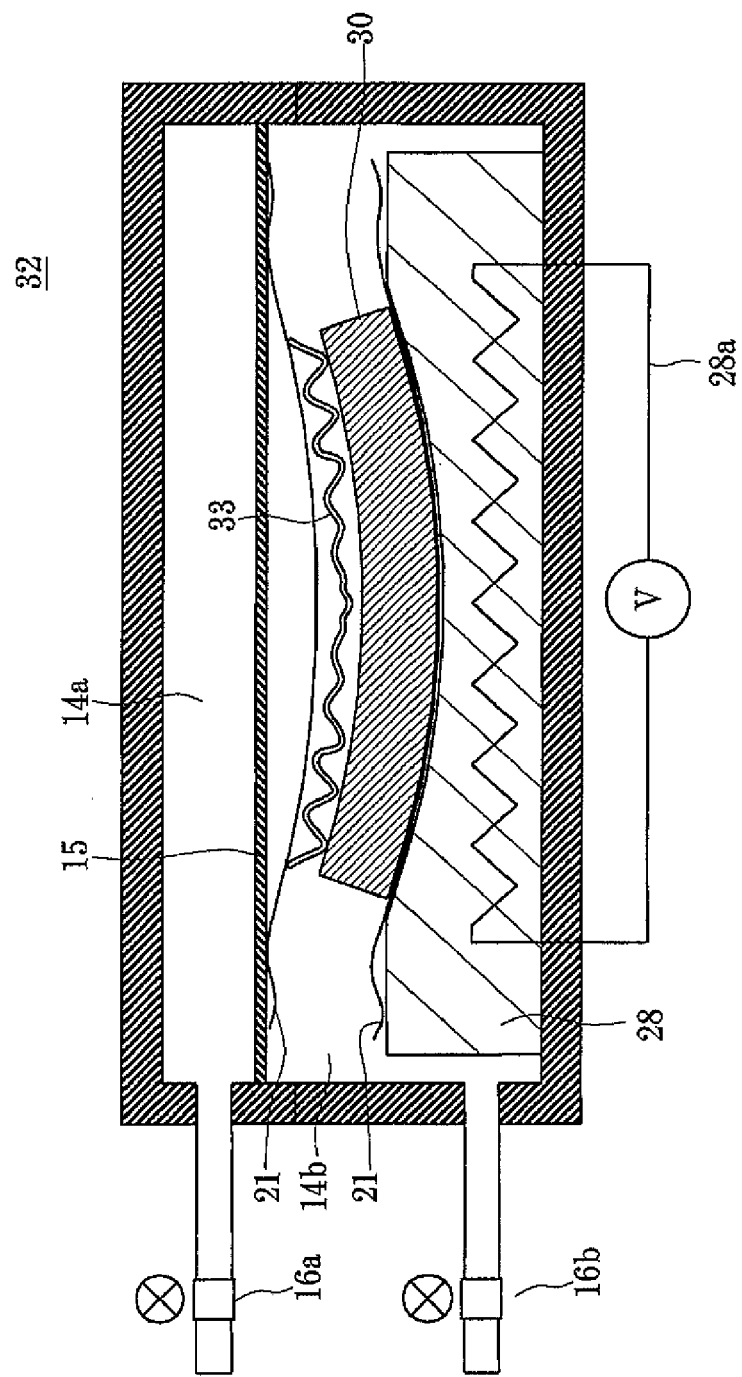
FIG. 11 is a cross-sectional view showing a configuration of a laminating apparatus used in manufacturing the solar cell module according to the third embodiment of the present invention.

FIG. 11 is a cross-sectional view showing a configuration of a laminating apparatus 32 used in manufacturing a solar cell 300 according to the third embodiment of the present invention. The laminating apparatus 32 has a pressing member 33 having a pressing surface on which a plurality of protrusions are formed. The pressing member 33 is structured such that the interval between the adjacent protrusions and the height of the protrusion become larger at a location closer to end portions than a central portion of the light-transmitting substrate 4 forming the module laminate 30 to be pressed. The other parts of the structure are the same as those of the laminating apparatus 22 according to the second embodiment.

Figure 12:
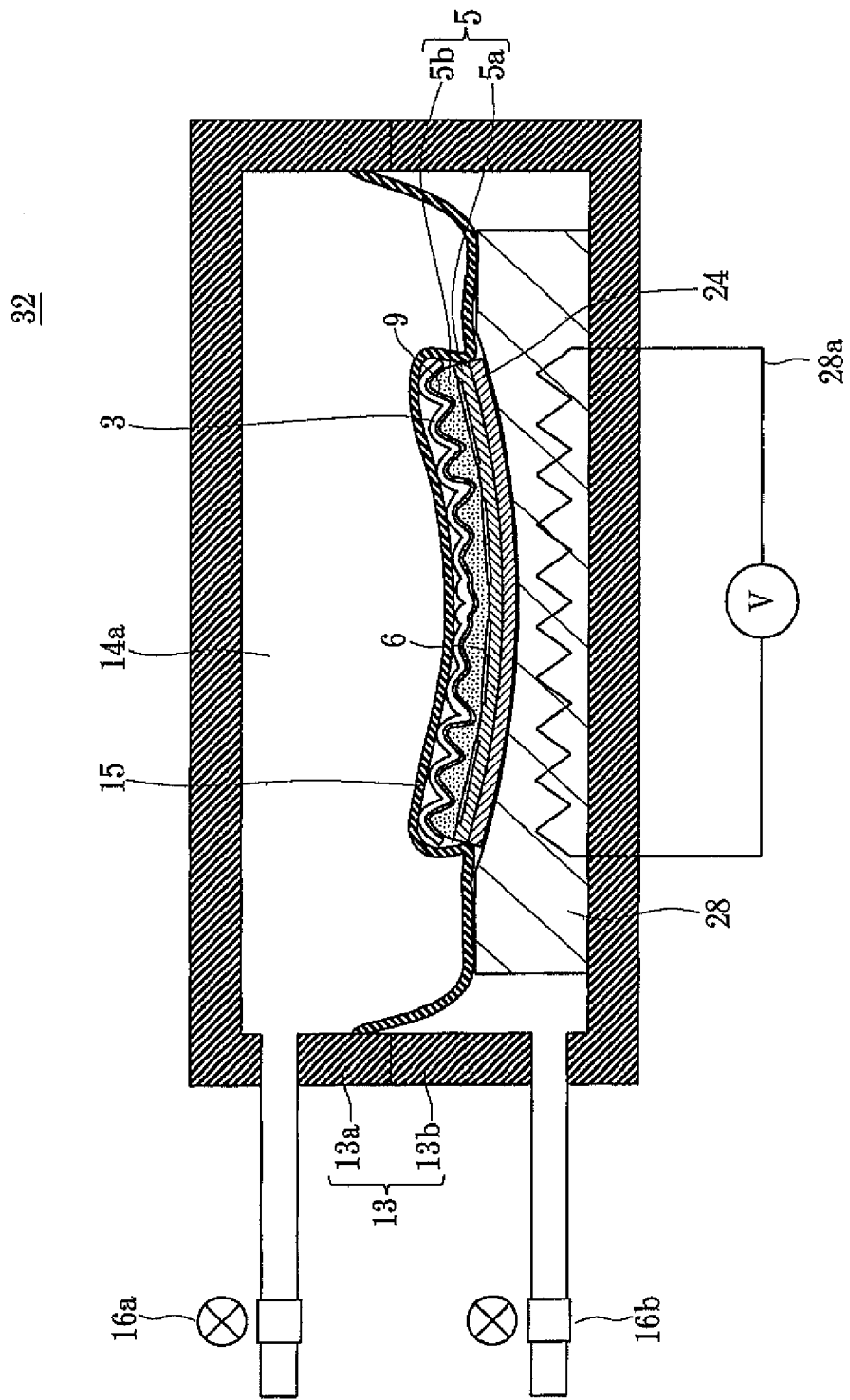
FIG. 12 is a cross-sectional view showing a method of manufacturing the solar cell module according to the third embodiment of the present invention.

FIG. 12 is a diagram showing a state after the module laminate 30 of this embodiment is press-heated. By pressing and heating the module laminate 30 by using the above-described laminating apparatus 32, protrusions and recesses which are substantially the same as those of the unevenness of the pressing member 33 are formed in the back-surface sheet 9 and the resin layer 5.

This can efficiently relieve wrinkles which conventionally tend to occur in end portions of the back-surface sheet 9.

<Modification>

In the above-described embodiment, a method in which the module laminate 10 is removed from the pressing member 3 of the laminating apparatus 2, and heated in the heating furnace is described. However, not only this but a method in which the module laminate 10 is heated in the heating furnace while the pressing member 3 is attached thereto may be adopted.

For example, it may be acceptable that a process in the heating furnace is performed in a state where pressure is applied to the module laminate 10 by placing a weight on the pressing member 3 disposed on the back-surface sheet 9. Any weight may be used as long as it is a member having a weight not relieving the unevenness transferred to the back-surface sheet 9 by the pressing member 3. It is preferable to use a glass plate or aluminium.

In this case, the press-heating step using the laminating apparatus 2 is performed until air bubbles existing within the module laminate 10 are sufficiently removed and the first resin layer 5a and the second resin layer 5b are charged throughout the surrounding area of the solar cell element 6. Then, the module laminate 10 with the weight placed on the pressing member is taken out of the laminating apparatus 2 and put into the heating furnace.

In this embodiment, the unevenness including a plurality of protrusions transferred to the back-surface sheet 9 is maintained by the weight. Therefore, the degree of cross-linking of the cross-linkable resin can be set low (for example, 10% or less) in the press-heating step, which can shorten a time required for the press-heating step. Additionally, the heating furnace is more excellent in productivity than the laminating apparatus 2 is, and many solar cell modules can be put therein. This can increase yield of the solar cell module, even when the same manufacturing machine as in the above-described embodiments is used.

The invention claimed is:

1. A solar cell module comprising:
   a base body;
   a plurality of solar cell elements arranged at intervals over said base body;
   a resin layer disposed on said solar cell elements and comprising a plurality of recesses on its surface facing opposite to said solar cell elements; and
   a protective sheet disposed on said resin layer,
   wherein
   said protective sheet comprises a plurality of protrusions which correspond to said recesses of said resin layer and which are in contact with said recesses,
   the height of a first protrusion at a location corresponding to the interval between said solar cell elements among said plurality of protrusions is higher than the height of a second protrusion at a location corresponding to said solar cell element among said plurality of protrusions,
   the interval between adjacent ones of said second protrusions in a portion corresponding to an end portion of said base body is longer than the interval between adjacent ones of said second protrusions in a portion corresponding to a central portion of said base body.

2. The solar cell module according to claim 1, wherein said base body comprises a curved surface whose central portion protrudes relative to an end portion thereof in a direction opposite to a said solar cell element side.

3. The solar cell module according to claim 2, wherein in said protective sheet, the interval between adjacent ones of said second protrusions and the height of said protrusion is longer with distance from a central portion of said curved surface.

4. The solar cell module according to claim 3, wherein in said protective sheet, the height of said second protrusion is higher with distance from a central portion of said curved surface.

5. A solar cell module comprising:
a base body;
a plurality of solar cell elements arranged at intervals over said base body;
a resin layer disposed on said solar cell elements and comprising a plurality of recesses on its surface facing opposite to said solar cell elements; and
a protective sheet disposed on said resin layer,
wherein
said protective sheet comprises a plurality of protrusions which correspond to said recesses of said resin layer and which are in contact with said recesses,
the height of a first protrusion at a location corresponding to the interval between said solar cell elements among said plurality of protrusions is higher than the height of a second protrusion at a location corresponding to said solar cell element among said plurality of protrusions,
the height of said second protrusion located in a portion corresponding to an end portion of said base body is higher than the height of said second protrusion located in a portion corresponding to a central portion of said base body.

6. The solar cell module according to claim 5, wherein
said base body comprises a curved surface whose central portion protrudes relative to an end portion thereof in a direction opposite to a said solar cell element side.

7. The solar cell module according to claim 6, wherein
in said protective sheet, the interval between adjacent ones of said second protrusions is longer with distance from a central portion of said curved surface.

8. The solar cell module according to claim 7, wherein
in said protective sheet, the height of said second protrusion is higher with distance from a central portion of said curved surface.

9. A method of manufacturing the solar cell module of claim 5, comprising:
preparing a module laminate which is formed by a solar cell element, a resin layer, and a protective sheet being put in layers in the mentioned order on a base body;
forming a plurality of protrusions on a surface of said resin layer side of said protective sheet; and
heating said resin layer in order to cure said resin layer,
wherein
the heating said resin layer is performed after the forming said plurality of protrusions.

10. The method of manufacturing a solar cell module according to claim 9, wherein
the forming said protrusion includes pressing a pressing surface of a pressing member to said surface of said protective sheet, said pressing surface having unevenness.

11. The method of manufacturing a solar cell module according to claim 10, wherein
said pressing member comprises a woven textile.

12. The method of manufacturing a solar cell module according to claim 11, wherein
said woven textile includes glass fibers, said glass fibers being impregnated with a fluorine resin.

* * * * *